United States Patent [19]
Bobenrieth

[11] 3,969,632
[45] July 13, 1976

[54] LOGIC CIRCUITS-EMPLOYING JUNCTION-TYPE FIELD-EFFECT TRANSISTORS

[75] Inventor: Albert Bobenrieth, Paris, France
[73] Assignee: Thomson-CSF, Paris, France
[22] Filed: Oct. 1, 1974
[21] Appl. No.: 510,985

Related U.S. Application Data

[62] Division of Ser. No. 267,213, June 28, 1972, abandoned.

[30] Foreign Application Priority Data

July 6, 1971 France .................... 71.24683

[52] U.S. Cl. .................. 307/205; 307/213; 307/215; 357/22
[51] Int. Cl.² ............ H03K 19/08; H03K 19/34; H03K 19/12; H01L 29/80
[58] Field of Search .......... 307/205, 215, 213, 304; 357/22

[56] References Cited
UNITED STATES PATENTS

| | | | |
|---|---|---|---|
| 3,422,359 | 1/1969 | Ladd, Jr., et al. | 307/215 X |
| 3,427,470 | 2/1969 | Marsh, Jr., et al. | 307/215 |
| 3,440,440 | 4/1969 | Prohofsky et al. | 307/215 X |
| 3,623,925 | 11/1971 | Jenkins et al. | 357/22 |
| 3,725,136 | 4/1973 | Morgan | 357/22 X |
| 3,813,585 | 5/1974 | Tarui et al. | 357/22 |

OTHER PUBLICATIONS

Wallmark et al, "Integrated Devices Using Direct-Coupled Unipolar Transistor Logic," IRE Transactions on Electronic Computers; pp. 98–105; 6/1959.
Sandfelder et al, "Logic Failure Simulation;" IBM Tech. Discl. Bull.; vol. 9, No. 4, pp. 422–423; 9/1966.
Schulz, "A High Speed Diode Coupled NOR Gate;" Solid/State/Design (pub.); pp. 52–53; 8/1962.
Harper, "Inverter Speed-up," IBM Tech. Discl. Bull.; vol. 12, No. 4, p. 537; 9/1969.

*Primary Examiner*—John S. Heyman
*Assistant Examiner*—Larry N. Anagnos
*Attorney, Agent, or Firm*—Cushman, Darby and Cushman

[57] ABSTRACT

A logic circuit uses a junction-type field-effect transistor.

The element comprises a transistor whose gate, by means of Zener diodes or forward-biased diodes is placed at a fixed potential so that it is blocked when one of its inputs carries the 0 level, and at another fixed potential, such that it is conductive, when all the inputs carry the 1 level.

3 Claims, 6 Drawing Figures

LOGIC CIRCUITS-EMPLOYING JUNCTION-TYPE FIELD-EFFECT TRANSISTORS

This is a division, of application Ser. No. 267,213 filed June 28, 1972, and now abandoned.

The present invention relates to logic circuits comprising field-effect transistors.

The Applicants filed a U.S. Pat. application, Ser. No. 183,565.

In this application, FIG. 1 describes a novel junction-type field-effect transistor produced by a novel method which makes use in particular of techniques of ion implantation and heat treatments at temperatures never in excess of 1,000°C.

The transistor obtained by this method has a semi-insulating substrate. Its parasitic capacitances are reduced because the accuracy obtained in the lateral dimensions of the component is extremely high whilst its area is very small.

The accuracy of the transverse dimensions likewise being very high, it is possible to produce very thin n-type or p-type films, with low dispersion.

The transistors thus obtained can be easily integrated and have numerous advantages over conventional transistors. Since the current is produced by majority charge carriers, the storage time is negligible whereas in conventional junction transistors, even gold-doped ones, it reaches $3 \times 10^{-9}$ secs.

The input resistance is much higher than that of these transistors. Finally, their manufacturing technology makes it possible to eliminate certain drawbacks of conventional junction-type field-effect transistors.

Their pinch-off voltage $V_p$ and consequently their blocking voltage $V_B \simeq - V_p$ is lower so that the gate bias voltage is in the order of 1v instead of 5v and the supply voltage can be reduced from 15v to a maximum of 8.

Moreover, the velocity of operation is increased, since the channel length is shortened. The drain capacitance is low and the current is therefore reduced.

An object of the present invention is logic circuits in which such transistors are used.

The invention will be better understood from a consideration of the ensuing description and by reference to the attached drawings in which.

Figure 6:
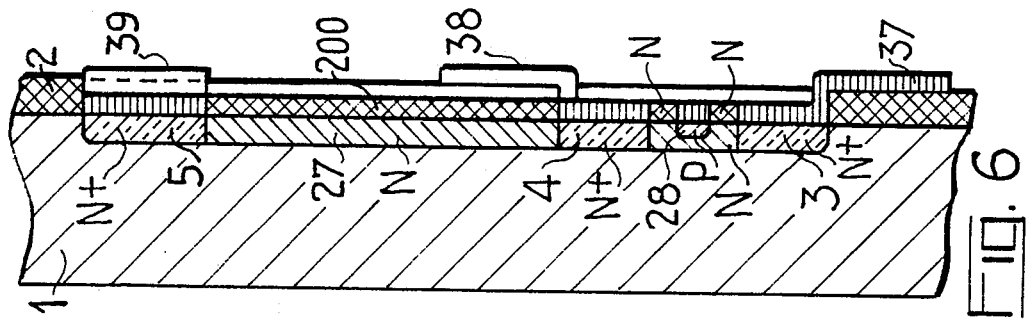
Figure 5:
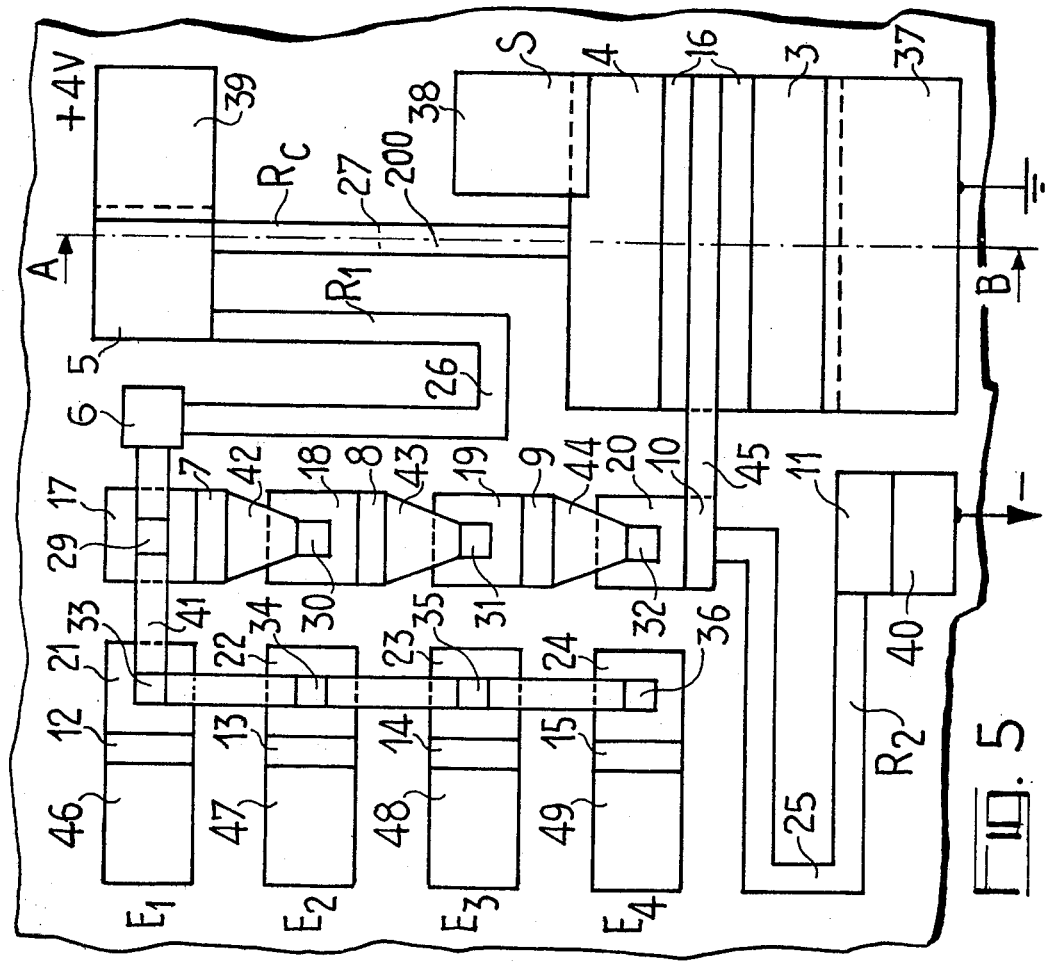

FIGS. 5 and 6 respectively illustrate in plan and in transverse section, an example of such an integrated circuit gate.

Figure 1:
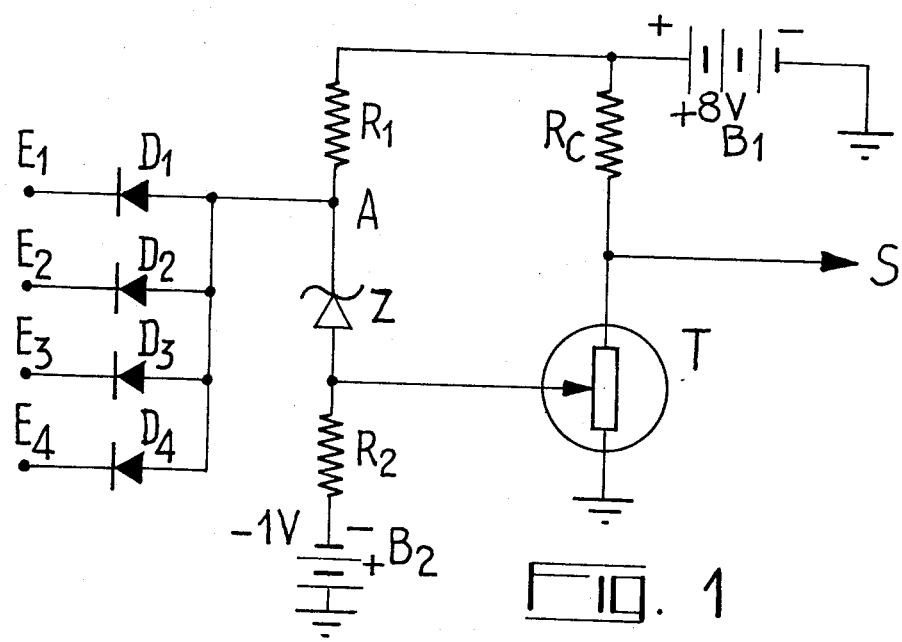
FIGS. 1, 2 and 3 illustrate examples of inverters in accordance with the invention.

In FIG. 1, a logic inverter of the type known as an AND-NOT gate, has been shown. It has four inputs $E_1$, $E_2$, $E_3$, $E_4$ and an output S.

If any of the inputs carries a voltage level corresponding to the digit 0, then the output should carry a voltage level corresponding to the digit 1.

If none of the inputs carries the level 0, that is to say if all of them carry the level 1, then the output should carry the level 0.

This circuit uses a transistor T of the type described in the afore-mentioned Patent Application. Its source is earthed. Its drain is connected to the positive terminal of the d.c. supply $B_1$, which supplies a voltage + 8 volts, across a resistor $R_C$.

Its gate is connected across a resistor $R_2$ to the negative terminal of a d.c. supply $B_2$, supplying a voltage − 1 v, on the one hand, and to one electrode of a Zener diode Z having a breakdown voltage of 5v, on the other. The other electrode of this diode is connected to the positive terminal of the battery $B_1$ across a resistor $R_1$.

Between the diode Z and the resistor $R_1$, at the point A, there are connected the four inputs $E_1$ to $E_4$ of the inverter, this across respective diodes $D_1$ to $D_4$ connected to operate in the forward direction towards said inputs.

The operation of the system is as follows:

The voltage applied to the inputs are of two levels, the level 0 corresponding for example to 1v, the level 1 to 8 v.

If one of the inputs is at the level 0, for example the input $E_1$, a first conductive path is established between the battery $B_1$ and the input $E_1$.

Since the diode $D_1$ is conductive, the potential at the point A is $\simeq 1.7$ volts, the voltage drop across a conductive diode being in the order of 0.7 v. Across the terminals of the Zener diode a voltage of less than 2.7 volts appears. This diode, since it does not conduct until around 5 v, remains blocked. The voltage applied to the gate of T is thus in the order of −1 v. Transistor T is therefore blocked. The output voltage appearing at output terminal S is equal to 8 v, that is to say level 1.

If all the inputs $E_1$ or $E_4$ are placed at level 1, that is to say 8v, the Zener diode conducts, the potential at A then being in the order of 5 v; the diodes $D_1$, $D_2$, $D_3$ and $D_4$ are all blocked.

There are then two other conductive paths, one from the battery $B_1$ to the battery $B_2$, the other from the battery $B_1$ to earth across transistor T which latter is then conductive the voltage applied to its gate being in the order of 0 v. The output voltage is in the order of 1 v, that is to say corresponding to level 0.

The circuit described is thus a logic AND-NOT gate or as it is more commonly known a NAND gate.

The structure described is applicable to a logic system with a high noise margin and large intervals between logic levels.

The transistor T has a blocking voltage $V_B$ (source-gate voltage beyond which it does not conduct), in the order of −1v. Its pinch-off voltage $V_p$ (source-drain voltage beyond which it is saturated, when the voltage applied to its gate is that applied to the source), is equal to $V_p = - V_B$.

Figure 2:
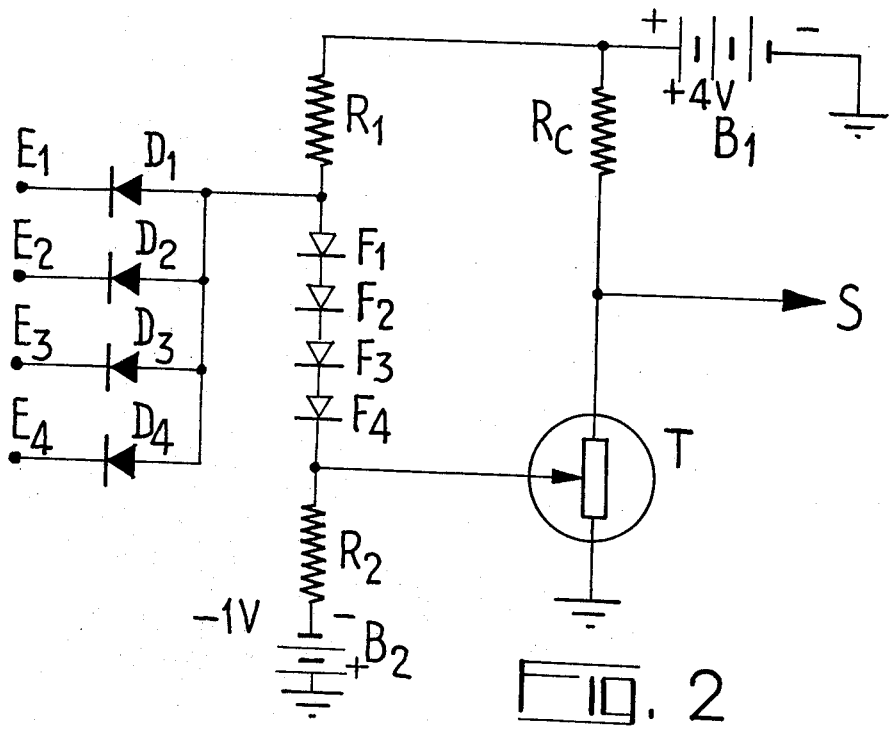

FIG. 2 illustrates a gate based upon the same principle, but with a narrower noise margin, $V_1 - V_0$ being in the order of 3 v and the supply voltage being around 4 v. In this figure, references which are the same as those used in the earlier figure, indicate the same elements.

The Zener diode has been replaced by four diodes $F_1$, $F_2$, $F_3$, and $F_4$ connected in series in the forward direction from $B_1$ to $B_2$; the input diodes are Schottky diodes with a threshold of $\simeq 0.5$ v. $B_1$ supplies + 4 v. The resistors $R_2$ and $R_1$ have resistances in the order of $10^5$ ohms. The operation is the same as in the preceding case.

One of the inputs $E_1$ for example is at the level 0, which corresponds to 1 v, the level 1 corresponding to 4 v.

The diode $D_1$ is conductive, and the potential A is in the order of 1.5 v, the resistance of $R_2$ being very high, and the voltages across the terminals of the diodes $F_1$ to $F_4$ is thus in the order of 2.5 v. However, the voltage required to drive them conductive is in the order of 3 v so that they remain blocked.

The gate voltage of the transistor T is thus around − 1 v. This transistor is therefore blocked. The voltage at S is at level 1, that is to say 4 v.

If all the inputs are at level 1, none of the diodes $D_1$ to $D_4$ conducts. By contrast, since the diodes $F_1$ to $F_4$ carry a voltage in excess of 3 v across their extreme terminals, they are conductive. The voltage on the gate is in the order of 0 v. The transistor T is in a conductive state, and the voltage $V_S$ drops to level 0, that is to say to a figure in the order of 1 v.

Figure 3:
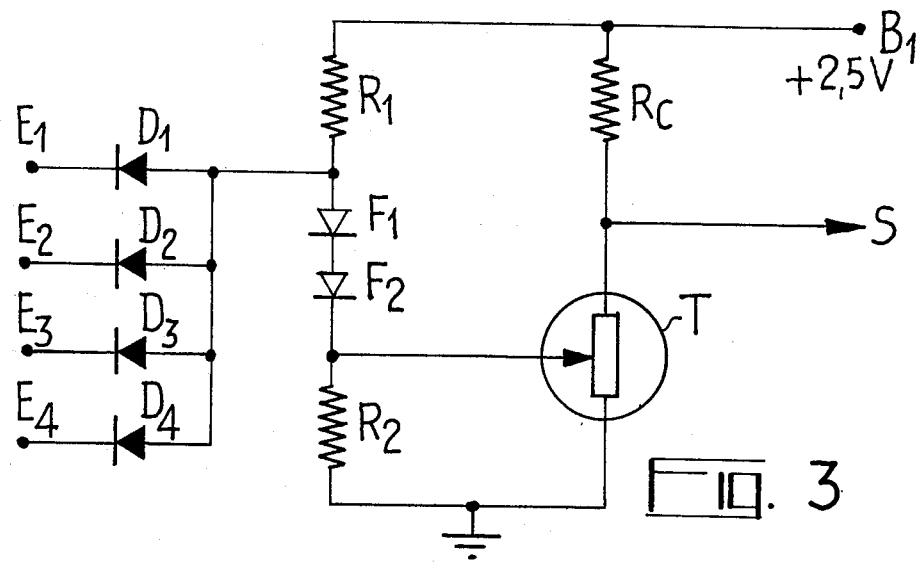

In FIG. 3, a transistor having a very small channel thickness is used. More precisely this thickness is equal to that of the depletion layer produced by the diffusion voltage at the control junction. In other words, if the gate voltage is 0, no current will flow from the source to the drain. Such a current will only flow if the gate is forward biased, the transistor operating then by the unpinching of the channel because the control voltage has the effect of reducing the depletion layer.

The gate is a Schottky gate or pn-junction. In the case of the Schottky gate, there is no injection of minority charge carriers when the gate is forward biased.

FIG. 3 illustrates a gate utilising this transistor. The supply voltage is 2.5 v $V_0 = 0.5$ v.

$V_1 = 2.5$ v.

the diode Z is replaced by two forward-operated diodes $F_1$ and $F_2$ and the resistor $R_2$ is earthed. The input diodes $D_1$, $D_2$, $D_3$, and $D_4$ are Schottky diodes with a threshold of $\simeq 0.5$ v.

The operation is the same as in the preceding cases. If all the inputs are at $V_0$ (0.5 volt) and the voltage at A is 1v, the diodes $F_1$ and $F_2$ do not conduct, the gate is at zero potential and the transistor T does not conduct.

Preferably, the diodes D will be Schottky diodes, because these do not involve minority charge carriers; the speed of operation is improved.

By contrast, the diodes F should be conventional junction type diodes because their threshold value is higher ($\simeq 0.7$ v) and the stored charge can accelerate the variations in gate potential. The diode Z can be of either type.

Figure 4:
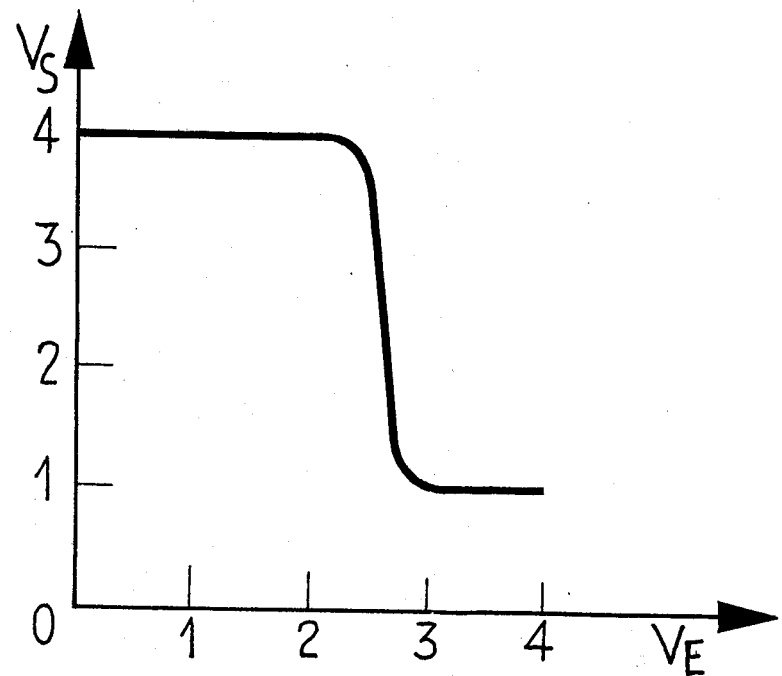
FIG. 4 is an explanatory diagram.

FIG. 4 illustrates the characteristic $V_S = f(V_E)$. for the case shown in FIG. 2.

In the present case, it is the current flowing through the transistor T which is used to feed the following stages. Thus it is the current passed at the saturation limit which determines the "fan out" that is to say the number of elements which the element in question can supply.

For low-consumption logic circuits, an input current $i_E$ of 30 $\mu$A can be taken as the basis.

If a "fan out" of 5 is required, then the saturation current of the transistor, at the voltage Vg corresponding to the logic level 0 (in the case of the output) or 1 (in the case of the input) should be slightly more than five times the input current of the following gates, taking into account the current flowing through the load resistor which can assumed to be in the order of $i_E$, so that:

$I_{DS}$ 1 $\simeq$ 200 $\mu$A for Vg = 0 volts.

The voltage $V_E$ corresponding to the 0 input condition, should be ≤ the pinch-off voltage $V_p$ of the transistor (output voltage at level 1), equal to the saturation voltage $V_S$ of the transistor; to obtain $V_p = V_S = $ 1v, a channel thickness of $\simeq 0.4$ $\mu$ for a concentration of n $\simeq 10^{16}$ at/cm$^{-3}$ is required.

Since the supply voltage is around 4 volts, the respective 0 and 1 are thus:
0 1 volt
1 4 volts
this gives us $R_C = (V_a - V_S)/i_E = 10^5 \Omega$
The noise margin is in the order of 1 volt in both directions.

The resistances $R_1$ and $R_2$ are equal to $R_C$.
The length of the channel is 2 $\mu$, and its width 40 $\mu$.

The two following figures illustrate the circuit of FIG. 2, in plan and transverse section, after integration by the method described in the Patent Application referred to earlier.

The substrate 1 is of p-conductive silicon with a concentration of $\simeq 10^{13}$ at-cm$^3$, that is to say it is a semiinsulator. A silica layer (SiO$_2$) 2 has been deposited upon the substrate, for example by cathode sputtering. Its thickness is around 8,000 A (FIG. 6).

Windows 3 for the source of the transistor T, 4 for its drain, 5 for the supply contact, 6 for the contact between the diodes $D_1$ to $D_4$ and the resistor $R_1$, 7, 8, 9 and 10 for the connection to the cathodes of the diodes $F_1$ to $F_4$, 11 for the contact connecting the resistor $R_2$ to the battery $B_2$, and 12, 13, 14, 15 for the connections to the cathodes of the diodes $D_1$ to $D_4$, are opened in this layer by a technique of electronic masking (FIGS. 5 and 6).

Using phosphorus ion implantation, there are implanted in these windows zones of n+ type (concentration 10$^{20}$ at/cm$^3$); the implantation energy is in the order of 100 Kev, and the thickness of the implanted layer is $\simeq 0.6$ $\mu$.

Using electronic masking and chemical or ion etching, the windows 16 are opened in order to delimit the channel of the transistor T, the windows 17, 18, 19, 20 to delimit the cathodes of the diodes $F_1$ to $F_4$, the windows 21, 22, 23, 24 to delimit the cathodes of the diodes $D_1$ to $D_4$, and the windows 25, 26, and 27 to respectively delimit the resistors $R_2$, $R_1$ to RC.

In these windows phosphorus ions are implanted at an energy of 150 Kev in order to produce a thickness of 0.7 $\mu$ and an impurity concentration of 10$^{16}$ at/cm$^3$.

The system is annealed at around 600°C for a half an hour in order to reconstitute the crystal lattice.

A new layer of SiO$_2$, 0.6 $\mu$ in thickness is deposited by cathode sputtering in order to reclose all these windows.

A window 28 is formed inside the old window 16, by electronic masking and chemical etching, in order to delimit the gate; at the same time, the windows 29, 30, 31, 32 in which the anodes of the diodes $F_1$ to $F_4$ are to be implanted, are formed.

In the zones corresponding to these windows, boron ions are implanted at an energy of 50 Kev. The thickness of the implanted layer is $\simeq 0.3$ $\mu$ and the p+ impurity concentration is $\simeq 10^{20}$ at/cm$^3$.

The channel thickness is thus $\simeq 4.10^{-5}$ cm. Annealing is carried out for half an hour at 800°C in order to reconstitute the crystal lattice.

Windows 3, 34, 35, 36 and 3, 4, 5, 6, 7, 8, 9, 10, 11, 12, 13, 14, 15 are opened by electronic masking and chemical etching or ion etching, in order to respectively delimit the anodes of the Schottky diodes $D_1$ to $D_4$ and the various contacts.

Aluminium is deposited over the whole of the surface using a cathode-sputtering process.

The Schottky diodes $D_1$ to $D_4$ and the contact zones 37 to 49 are then delimited by electronic masking and chemical or ion etching.

A gate of this kind draws around 160 $\mu$W.

It has a propagation time of some nanoseconds.

Logic circuits of this kind are more highly resistant to the effects of radiation than ones manufactured using MOS transistors. They are little affected by the application of over-voltages to the gate.

What I claim is:

1. A logic circuit integrated upon a semi-insulating substrate comprising a d.c. supply, a junction type field-effect transistor having ion implanted source drain and channel regions, having a predetermined type of conductivity and a metal gate forming with said channel a Schottky junction, said channel having a thickness equal to that of the depletion zone produced by a zero potential applied to said gate junction, said logic circuit comprising at least two inputs and one output, means for carrying selectively said inputs at two predetermined voltage values corresponding respectively to the digit 0 and the digit 1, first resistor means for connecting said drain to said d.c. supply, said output being connected to said drain, said source being grounded, second resistor means for connecting said gate to ground, for applying to said gate a voltage near zero; rectifying means for connecting selectively said inputs to said carrying means for establishing a first conduction path between at least one of said inputs and said supply where said at least one input is at the 0 level, means for establishing a second conductive path between said d.c. supply and the ground, where all the rectifying means are not conductive, and giving to said gate a voltage rendering said transistor conductive.

2. A logic circuit as claimed in claim 1, wherein said source, drain and channels are of the n type of conductivity, said substrate having a doping concentration of the order of $10^{14}$ at/cm$^3$, said source and drains a doping concentration of the order of $10^{20}$ at/cm$^3$, said channel a doping concentration of about $10^{16}$ at/cm$^3$ and a thickness near 0.4 micron.

3. An integrated logic circuit element comprising: a first and second d.c. supply of opposite polarities, said first supply supplying a voltage substantially equal to 2.5 volts and said second supply supplying a voltage between 0 and 0.5 volt in absolute value, a junction type field effect transistor including a gate electrode, source and drain regions and having an n type channel with a thickness equal to that of the depletion zone obtained by applying to said gate the source potential and comprising at least two inputs and one output, and means for carrying selectively said inputs at two predetermined level values significant respectively the digit 0 and the digit 1; first resistor means for connecting said drain to said first supply; said output being connected to said drain, and the source of said transistor being grounded, second resistor means connecting the gate of the transistor to the second supply, for applying to said gate a voltage comprised between 0 and approximately 1 volt; rectifying means for connecting respectively said inputs to said first supply, for establishing a first conduction path between at least one of said inputs and said first supply, when said at least one of said inputs is at the level 0, said gate being at a potential level, rendering said transistor blocked, means for establishing a second conduction path between said first and said second supply when all said rectifying means are not conductive, and giving to said gate a voltage rendering said transistor conductive, said establishing means including several diodes cascade connected and biased in the forward directions, when said rectifying means are all blocked.

* * * * *